(12) United States Patent
Na et al.

(10) Patent No.: US 9,847,781 B2
(45) Date of Patent: Dec. 19, 2017

(54) RADIO FREQUENCY SWITCH INCLUDING FILTER CIRCUIT

(71) Applicant: SAMSUNG ELECTRO-MECHANICS CO., LTD., Suwon-Si, Gyeonggi-Do (KR)

(72) Inventors: Yoo Sam Na, Suwon-Si (KR); Jong Myeong Kim, Suwon-Si (KR); Hyun Jin Yoo, Suwon-Si (KR); Hyun Hwan Yoo, Suwon-Si (KR); Yoo Hwan Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 250 days.

(21) Appl. No.: 14/609,244

(22) Filed: Jan. 29, 2015

(65) Prior Publication Data

US 2015/0256147 A1    Sep. 10, 2015

(30) Foreign Application Priority Data

Mar. 5, 2014    (KR) ................. 10-2014-0025999

(51) Int. Cl.
*H03K 17/62* (2006.01)
*H03K 17/693* (2006.01)
*H03H 11/24* (2006.01)

(52) U.S. Cl.
CPC ........... *H03K 17/62* (2013.01); *H03K 17/693* (2013.01); *H03H 11/245* (2013.01); *Y10T 307/76* (2015.04)

(58) Field of Classification Search
CPC .... H03K 17/62; H03K 17/693; H03K 17/063; H03K 17/16; H03K 17/6871; H03K 17/74; H03K 17/76
USPC .......................... 327/365, 379, 430; 455/333
See application file for complete search history.

(56) References Cited

U.S. PATENT DOCUMENTS

| 8,093,940 | B2 | 1/2012 | Huang et al. |
| 8,244,199 | B2 * | 8/2012 | Goto ............... H01L 21/823425 257/280 |
| 2014/0009214 | A1 * | 1/2014 | Altunkilic ............ H03K 17/161 327/427 |

FOREIGN PATENT DOCUMENTS

| JP | 2002-305462 A | 10/2002 |
| KR | 10-2012-0067275 A | 6/2012 |

* cited by examiner

*Primary Examiner* — John Poos
(74) *Attorney, Agent, or Firm* — NSIP Law

(57) ABSTRACT

A radio frequency switch may include a common port transmitting and receiving a radio frequency signal, a first switching unit including a plurality of first switch elements connected in series and opening or closing a signal transfer path between a first port inputting and outputting the radio frequency signal and the common port, and a second switching unit having a plurality of second switch elements connected in series and opening or closing a signal transfer path between a second port inputting and outputting the radio frequency signal and the common port. The second switching unit further includes a first filter circuit unit connected to a control terminal of at least one second switch element among the plurality of second switch elements to remove at least one preset frequency band signal.

13 Claims, 11 Drawing Sheets

RADIO FREQUENCY SWITCH INCLUDING FILTER CIRCUIT

CROSS-REFERENCE TO RELATED APPLICATION

This application claims priority to, and the benefit of, Korean Patent Application No. 10-2014-0025999 filed on Mar. 5, 2014, with the Korean Intellectual Property Office, the disclosure of which is incorporated herein by reference.

BACKGROUND

The present disclosure relates to a radio frequency switch.

In accordance with development of wireless communications technology, various communications standards have been used simultaneously. In addition, in accordance with the miniaturization of wireless communications modules and improvements in the performance of portable terminals, conformity of a single portable terminal with a plurality of communications standards has been demanded. Therefore, an amount of frequency bands within which a single cellular phone should be able to operate has increased.

For example, in terms of cellular communications, existing second-generation (2G) and third-generation (3G) communications technologies have been complimented, such that fourth-generation (4G) communications schemes such as Long Term Evolution (LTE) have been widely applied to mobile phones. In addition, in terms of Wi-Fi, the IEEE 802.11ac standard has been added to the existing IEEE 802.11b/g/n standard to allow for growth in the mobile communications field.

In accordance with this trend, support for various frequency bands in a radio frequency (RF) front end field has also been demanded. Here, support for various frequency bands with respect to a radio frequency switch positioned on a signal path between an antenna and an RF chipset has been demanded. Therefore, a single pole double throw (SPDT) type switch has been used in various fields.

The radio frequency switch may decrease interference between a transmitting unit and a receiving unit by using Time-Division Multiplexing (TDM). In this case, the radio frequency switch requires low insertion loss characteristics, high power handling characteristics, isolation characteristics, and the like. In addition, a linearity improvement method for securing output power has become important.

RELATED ART DOCUMENT

Japanese Patent Laid-Open Publication No. 2002-305462

SUMMARY

An aspect of the present disclosure may provide a radio frequency switch capable of removing second harmonic components input through a control terminal generating non-linear components in a switch element and increasing linearity.

According to an aspect of the present disclosure, a radio frequency switch may include: a common port transmitting and receiving a radio frequency signal; a first switching unit including a plurality of first switch elements connected in series and opening or closing a signal transfer path between a first port inputting and outputting the radio frequency signal and the common port; and a second switching unit having a plurality of second switch elements connected in series and opening or closing a signal transfer path between a second port inputting and outputting the radio frequency signal and the common port. The second switching unit may further include a first filter circuit unit connected to a control terminal of at least one second switch element among the plurality of second switch elements to remove at least one preset frequency band signal.

The first filter circuit unit may remove a second harmonic component input from the control terminal of the at least one second switch element.

The first filter circuit unit may include at least one capacitor and at least one inductor connected to the at least one capacitor in parallel or in series.

The first filter circuit unit may attenuate a signal within a frequency band determined according to the at least one capacitor and the at least one inductor.

The radio frequency switch may further include: a first shunting unit connected between the second port and the second switching unit to conduct or block electricity on a signal transfer path between the second port and a ground; and a second shunting unit connected between the first port and the first switching unit to conduct or block electricity on a signal transfer path between the first port and a ground. The first shunting unit may have a plurality of third switch elements connected in series and the second shunting unit may have a plurality of fourth switch elements connected in series.

The first shunting unit may further include a filter circuit unit connected to a control terminal of at least one third switch element among the plurality of third switch elements, and the filter circuit unit may remove a second harmonic component input from the control terminal of the at least one third switch element.

The first filter circuit unit may be connected to a control terminal of a second switch element disposed closest to the second port and connected to the second port.

According to another aspect of the present disclosure, a radio frequency switch may include: a common port transmitting and receiving first and second radio frequency signals; a first switching unit including a plurality of first switch elements connected in series and opening or closing a signal transfer path between a first port inputting and outputting the first radio frequency signal and the common port; and a second switching unit having a plurality of second switch elements connected in series and opening or closing a signal transfer path between a second port inputting and outputting the second radio frequency signal and the common port. The second switching unit may further include a first filter circuit unit connected to a control terminal of at least one second switch element among the plurality of second switch elements and having at least one capacitor and at least one inductor connected to the at least one capacitor in parallel or in series.

The first filter circuit unit may be connected to a control terminal of a second switch element positioned closest to the second port among the plurality of second switch elements.

The first filter circuit unit may remove a second harmonic component input from the control terminal of the at least one second switch element.

The first filter circuit unit may remove at least one preset frequency band signal, from the second radio frequency signal, and the at least one preset frequency band signal may be determined according to the at least one capacitor and the at least one inductor.

The radio frequency switch may further include: a first shunting unit connected between the second port and the second switching unit to conduct or block electricity on a signal transfer path between the second port and a ground;

and a second shunting unit connected between the first port and the first switching unit to conduct or block electricity on a signal transfer path between the first port and a ground. The first shunting unit may have a plurality of third switch elements connected in series and the second shunting unit may have a plurality of fourth switch elements connected in series.

The first shunting unit may further include a second circuit unit connected to a control terminal of at least one third switch element among the plurality of third switch elements, and the filter circuit unit may remove a second harmonic component input from the control terminal of the at least one third switch element.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
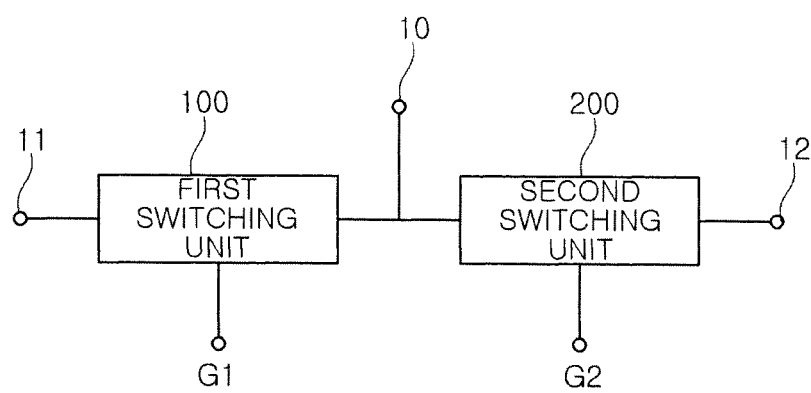
FIG. 1 is a block diagram illustrating a radio frequency switch according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

Throughout the drawings, the same or like reference numerals will be used to designate the same or like elements.

FIG. 1 is a block diagram illustrating a radio frequency switch according to an exemplary embodiment in the present disclosure.

Figure 2:
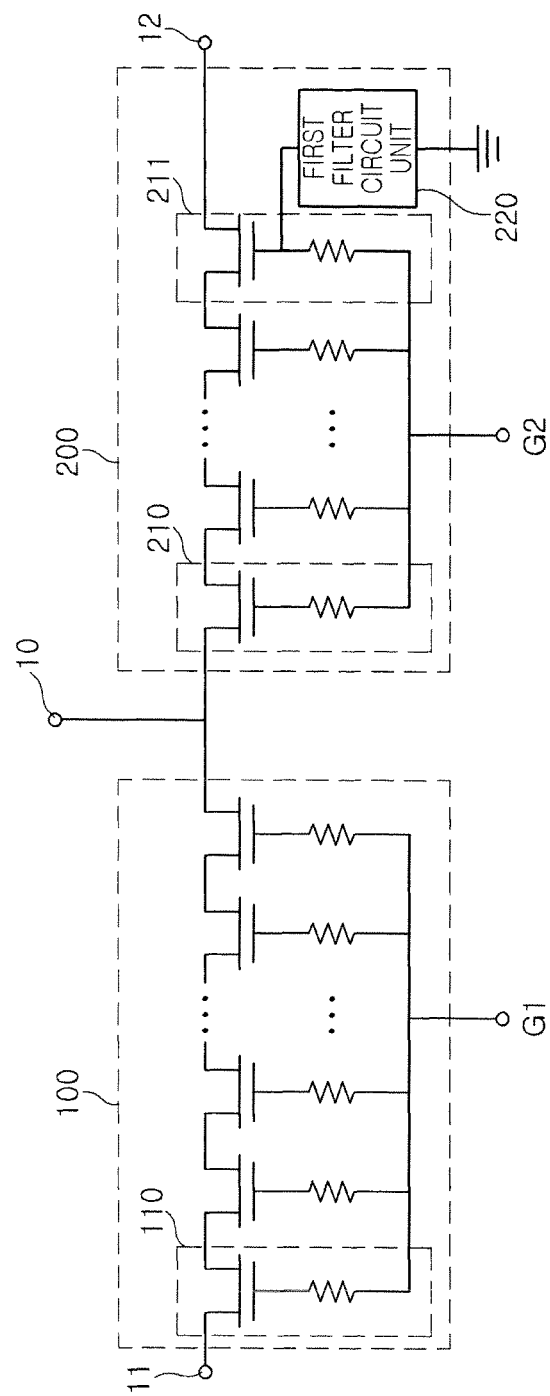
FIG. 2 is a circuit diagram illustrating the radio frequency switch illustrated in FIG. 1 in more detail.

FIG. 2 is a circuit diagram illustrating the radio frequency switch illustrated in FIG. 1 in more detail.

Referring to FIGS. 1 and 2, a radio frequency switch according to an exemplary embodiment in the present disclosure may include a common port 10, a first switching unit 100, and a second switching unit 200.

The common port 10 may be connected to an antenna to transmit and receive a radio frequency signal.

In further detail, a first port 11 may be connected to the antenna to transmit and receive a first radio frequency signal and a second port 12 may be connected to the antenna to transmit and receive a second radio frequency signal.

The first switching unit 100 may be connected between the common port 10 and the first port 11 and may conduct or block electricity on a signal transfer path therebetween. The first switching unit 100 may include a plurality of first switch elements 110 (see, FIG. 2) connected in series.

The second switching unit 200 may be connected between the common port 10 and the second port 12 and may conduct or block electricity on a signal transfer path therebetween. The second switching unit 200 may include a plurality of second switch elements 210 (see, FIG. 2) connected in series.

Meanwhile, each of the first switch element and the second switch element included in the first switching unit 100 and the second switching unit 200 may be a field effect transistor (FET) or a bipolar junction transistor (BJT).

Hereinafter, a case in which the first and second switch elements 110 and 210 are determined as a metal oxide silicon field effect transistor (MOSFET) will be described by way of example. In this case, the number of MOSFETs configuring the first switching unit 100 may be appropriately changed by a withstand voltage required for the first switching unit 100. In addition, each of a plurality of MOSFETs has a source terminal and a drain terminal indistinguishable from each other in terms of MOSFET structural characteristics.

Therefore, in the present specification, 'MOSFETs connected in series' indicates a state in which one of source and drain terminals of one MOSFET is connected to one of source and drain terminals of another MOSFET.

In the case of the plurality of first and second switch elements 110 and 210, a respective control terminal thereof may be connected to a gate resistor in series.

In this case, the control terminals of the plurality of first switch elements 110 may be connected to a first common control terminal (G1) through the plurality of gate resistors to receive a control signal. In addition, the control terminals of the plurality of second switch elements 210 may be connected to a second common control terminal (G2) through the plurality of gate resistors to receive the control signal.

Meanwhile, the first switching unit 100 may perform a switching operation by receiving the control signal from the first common control terminal (G1), and in further detail, may conduct or block electricity on the signal transfer path between the first port 11 and the common port 10.

For example, in order to conduct electricity on the signal transfer path between the first port 11 and the common port 10, all of the plurality of first switch elements 110 may be turned-on, or, in order to block electricity on the signal transfer path between the first port 11 and the common port 10, all of the plurality of first switch elements 110 may be turned-off.

The second switching unit 200 may perform a switching operation by receiving the control signal from the second common control terminal (G2), and in further detail, may conduct or block electricity on the signal transfer path between the second port 12 and the common port 10.

For example, in order to conduct electricity on the signal transfer path between the second port 12 and the common port 10, all of the plurality of second switch elements 210 may be turned-on, or in order to block electricity on the signal transfer path between the second port 12 and the common port 10, all of the plurality of second switch elements 210 may be turned-off.

The second switching unit 200 may further include a first filter circuit unit 220 connected to a control terminal of at least one of the plurality of second switch elements.

In this case, the first filter circuit unit 220 may be connected to the control terminal of a second switch element 211 disposed closest to the second port 12, byway of example. However, the present disclosure is not limited thereto.

Hereinafter, a case in which the first filter circuit unit 220 is connected to the control terminal of the second switch element 211 will be described by way of example.

The first filter circuit unit 220 may remove at least one preset frequency band signal, and in further detail, may remove a second harmonic component input through the control terminal of the second switch element 211. A description thereof will be provided below with reference to FIG. 3.

Figure 3:
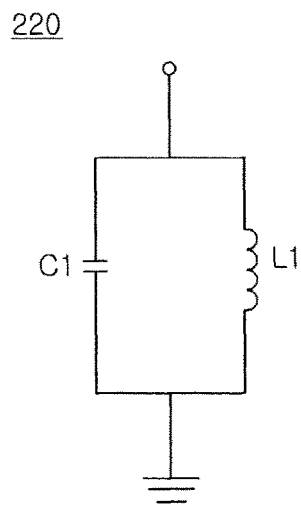
FIG. 3 is a circuit diagram illustrating an example of a first filter circuit unit among the configurations of the radio frequency switch illustrated in FIG. 2.

FIG. 3 is a circuit diagram illustrating an example of the first filter circuit unit 220 among the configurations of the radio frequency switch illustrated in FIG. 2.

Referring to FIGS. 2 and 3, as an example, the first filter circuit unit 220 may include a capacitor C1 and an inductor L1. In this case, the capacitor C1 and the inductor L1 may be connected in parallel or in series. The respective numbers of capacitors C1 and inductors L1 included in the first filter circuit unit 220 are not limited to one illustrated in FIG. 3.

In addition, the first filter circuit unit 220 may be coupled to a point different from that illustrated in FIG. 2 and the second switching unit 200 may include one or more first filter circuit units 220. For example, the radio frequency switch according to an exemplary embodiment in the present disclosure is not limited to the configuration illustrated in FIG. 2.

The first filter circuit unit 220 may attenuate a signal within a frequency band determined according to the capacitor C1 and the inductor L1.

In further detail, the first filter circuit unit 220 may be designed to allow all frequencies to be passed therethrough, except for those in a preset frequency band.

For example, signals within the preset frequency band may be attenuated. In this case, the signals within the preset frequency band may be determined according to a signal level of the capacitor C1 and the inductor L1.

In a radio frequency switch according to the related art, different paths may share one antenna in an SPDT switch structure. Since a signal passing through a Tx path among the different paths is a large signal, a degree of linearity of the radio frequency switch may be determined depending on linearity of a plurality of switch elements present on the Tx path and whether or not the plurality of switch elements are surely maintained in a turned-off state.

Meanwhile, the large signal is caused by a parasitic capacitor occurring in a source, a control terminal, and a drain of a transistor, and linearity characteristics of the radio frequency switch may be determined depending on linearity distortion due to second and third harmonic components among harmonics of the large signal.

The radio frequency switch according to an exemplary embodiment in the present disclosure may remove the second harmonic component among non-linear components of a signal input through the parasitic capacitor by including the first filter circuit unit 220 connected to a control terminal of the second switch element 211.

Figure 4:
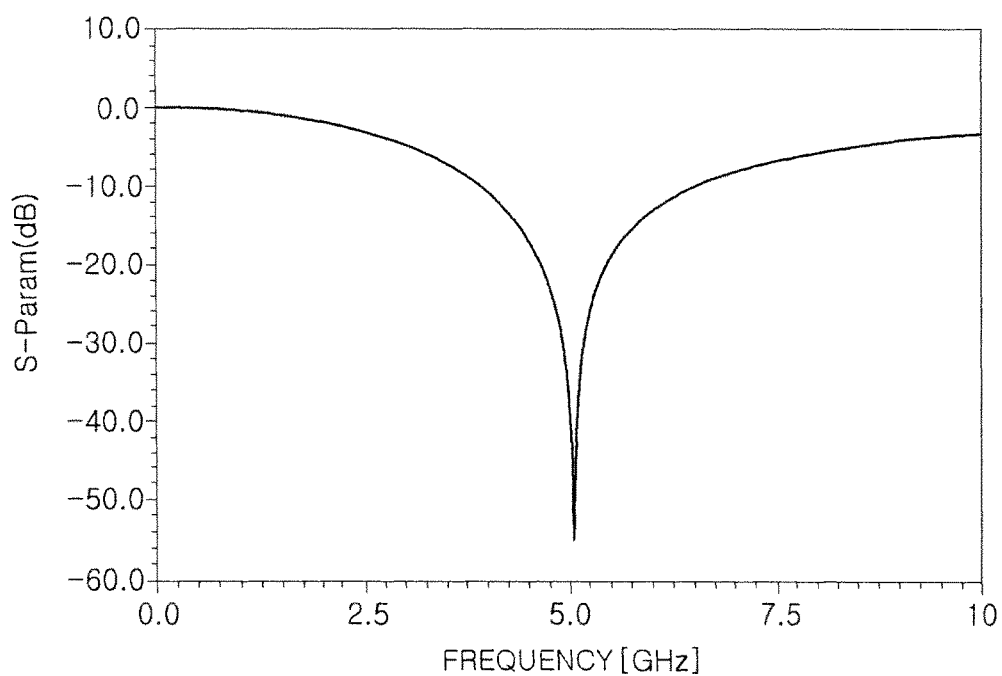
FIG. 4 is a graph illustrating an alternating current waveform of the first filter circuit unit at 5 GHz, a second harmonic for a signal of 2.5 GHz, in the radio frequency switch according to an exemplary embodiment in the present disclosure.

FIG. 4 is a graph illustrating an alternating current waveform of the first filter circuit unit at 5 GHz, a second harmonic for a signal of 2.5 GHz, in the radio frequency switch according to an exemplary embodiment in the present disclosure.

Referring to FIG. 4, it may be appreciated that a frequency is sharply attenuated at 5 GHz, a second harmonic for a signal of 2.5 GHz, in the radio frequency switch according to an exemplary embodiment in the present disclosure.

Figure 5A:
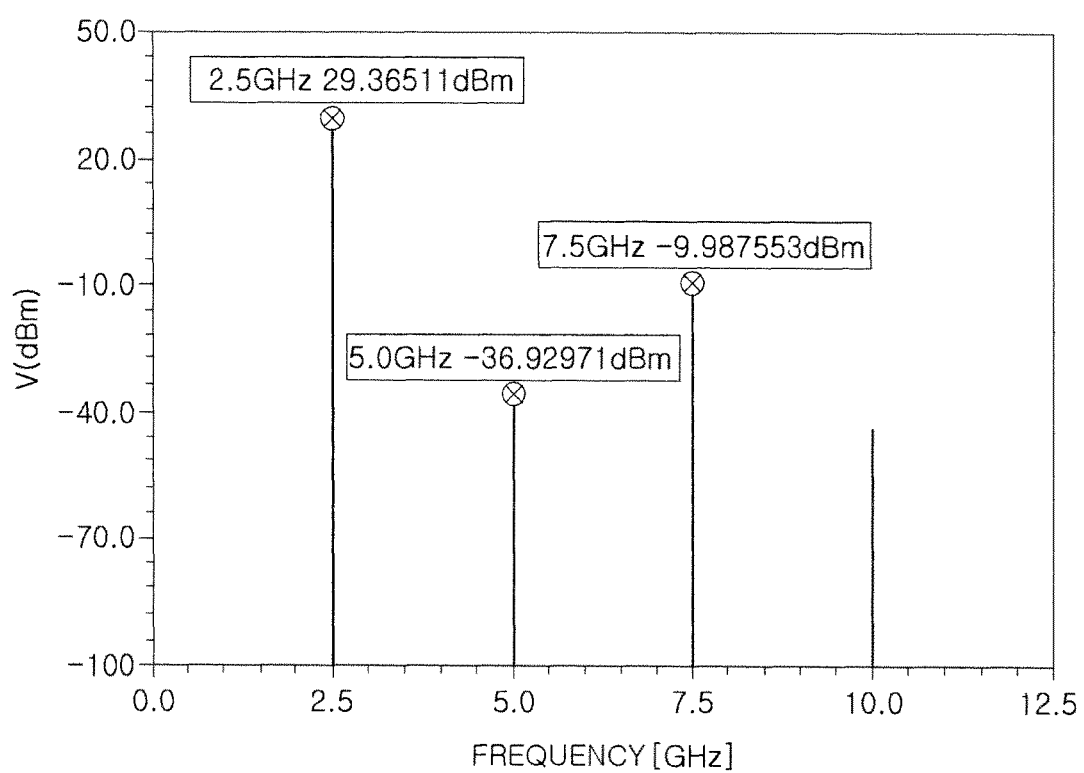
FIG. 5A is a graph illustrating second harmonic components in a radio frequency switch according to the related art.

FIG. 5A is a graph illustrating second harmonic components in a radio frequency switch according to the related art.

Figure 5B:
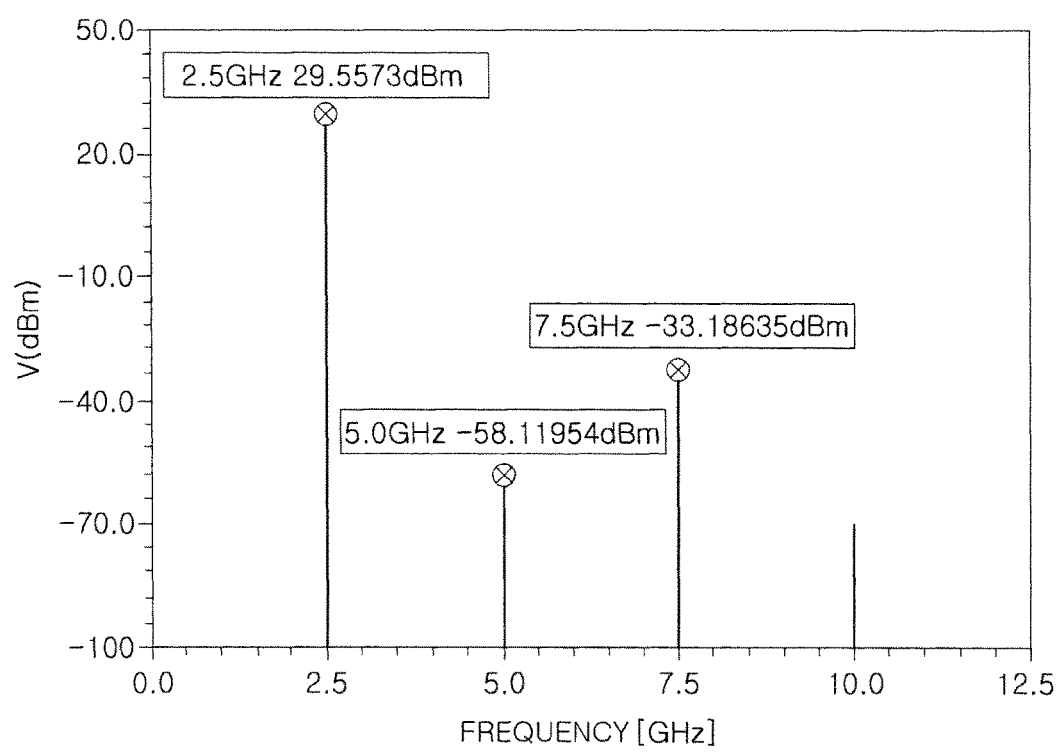
FIG. 5B is a graph illustrating transient signals in the radio frequency switch according to an exemplary embodiment in the present disclosure.

FIG. 5B is a graph illustrating transient signals in the radio frequency switch according to an exemplary embodiment in the present disclosure.

Referring to FIG. 5A, it may be appreciated that the second harmonic component corresponding to 5 GHz is −36 dBm. On the other hand, referring to FIG. 5B, it may be appreciated that the second harmonic component corresponding to 5 GHz is −58 dBm.

For example, referring to FIGS. 5A and 5B, it may be appreciated that the second harmonic component of the radio frequency switch according to an exemplary embodiment in the present disclosure is decreased from −36 dBm to −58 dBm as compared to the case of the radio frequency switch according to the related art.

Figure 6:
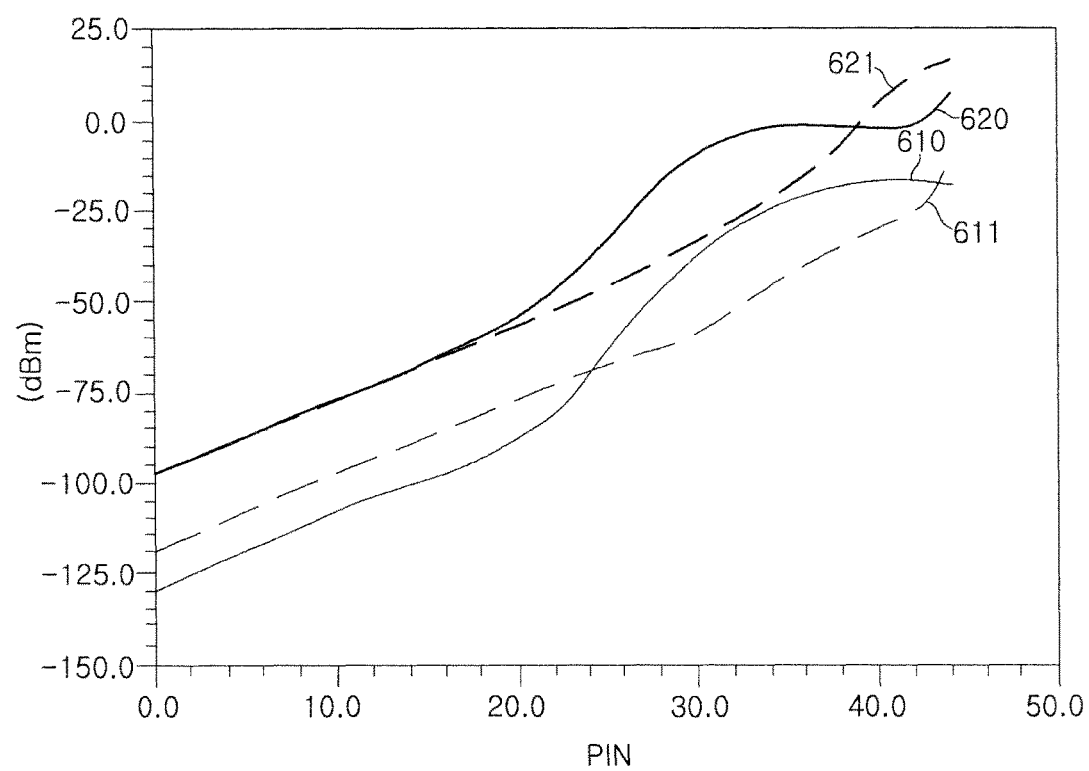
FIG. 6 is a graph illustrating second and third harmonic waveforms in the radio frequency switch according to an exemplary embodiment in the present disclosure.

FIG. 6 is a graph illustrating second and third harmonic waveforms in the radio frequency switch according to an exemplary embodiment in the present disclosure.

FIG. 6 is a graph illustrating power sweep simulation results for second harmonic components 610 and 611 and third harmonic components 620 and 621.

In this case, as described in FIGS. 4 and 5B, the radio frequency switch according to an exemplary embodiment in the present disclosure may remove the second harmonic component corresponding to 5 GHz by the first filter circuit unit 200 connected to the control terminal of at least one second switch element 211.

As a result, referring to FIG. 6, it may be appreciated that linearity characteristics in the case of the second harmonic component 611 according to the exemplary embodiment in the present disclosure is relatively further improved as compared to the case of the second harmonic component 610 of the radio frequency switch according to the related art.

In addition, referring to FIG. 6, it may be appreciated that linearity characteristics in the case of the third harmonic component 621 according to the exemplary embodiment in the present disclosure is more improved as compared to the case of the third harmonic component 620 of the radio frequency switch according to the related art. This shows that as the second harmonic component 611 of the radio frequency switch according to the exemplary embodiment in the present disclosure is decreased, the level of the third harmonic component 621 is decreased, thereby resulting in improvement of overall linearity characteristics.

Figure 7A:
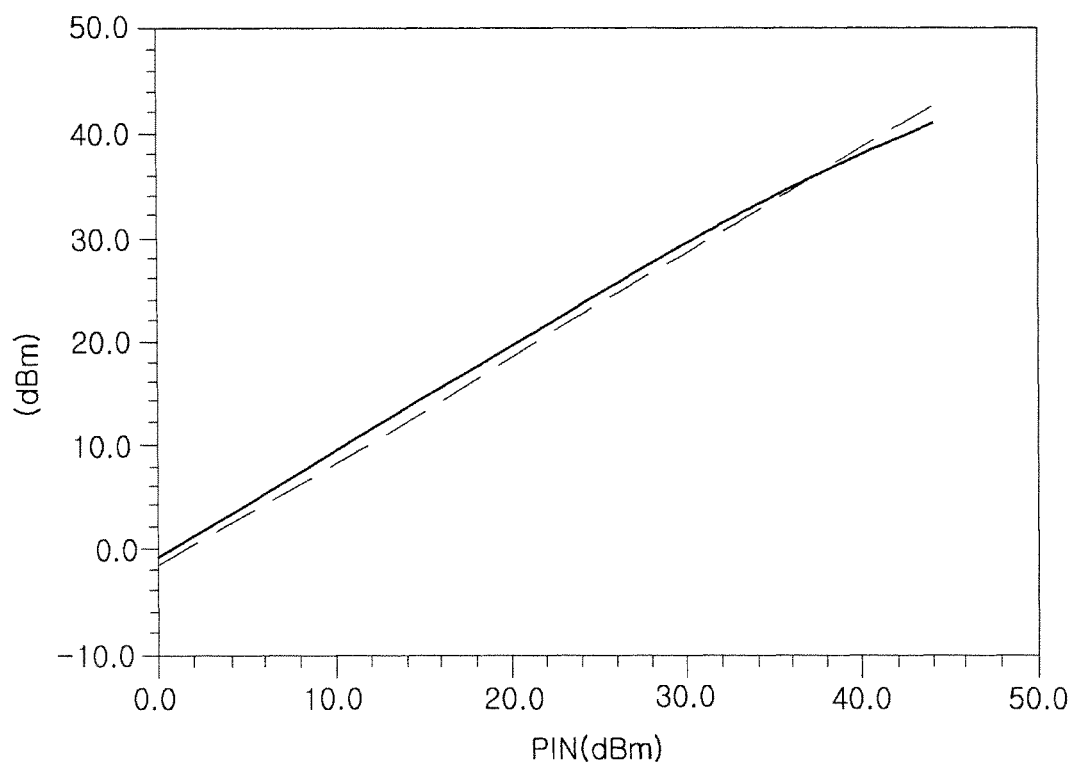
FIG. 7A is a graph illustrating a P1 dB simulation waveform in the radio frequency switch according to the related art.

FIG. 7A is a graph illustrating a P1 dB simulation waveform in the radio frequency switch according to the related art.

Figure 7B:
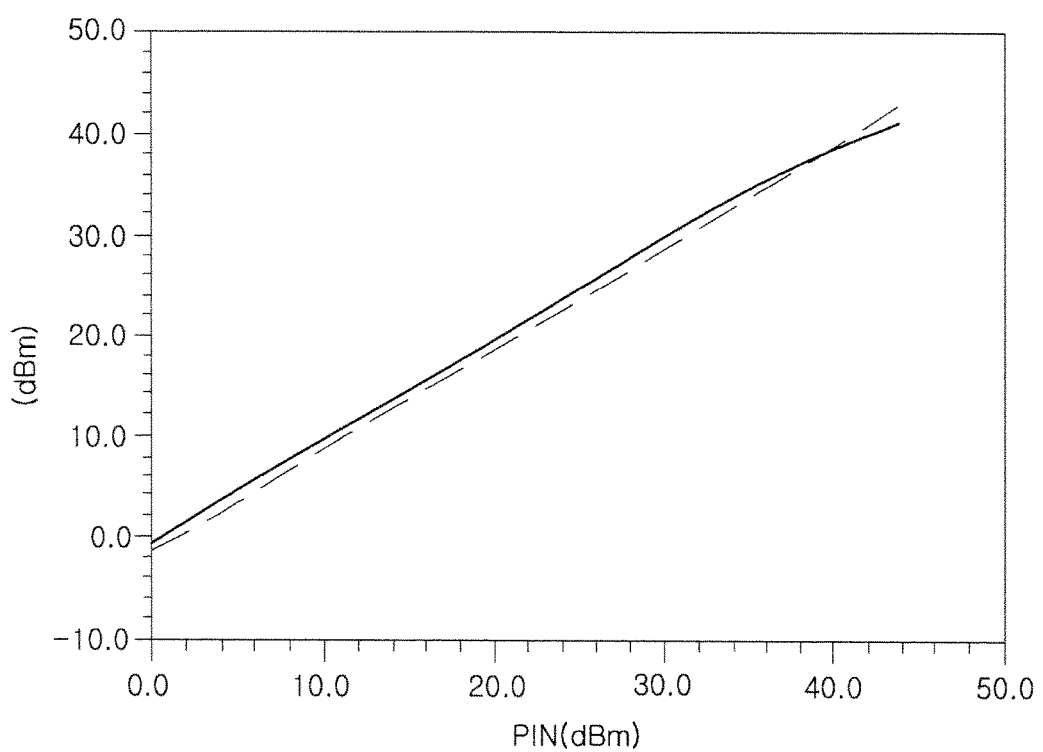
FIG. 7B is a graph illustrating a P1 dB simulation waveform in the radio frequency switch according to an exemplary embodiment in the present disclosure.

FIG. 7B is a graph illustrating a P1 dB simulation waveform in the radio frequency switch according to an exemplary embodiment in the present disclosure.

The improvement of overall linearity characteristics of the radio frequency switch according to an exemplary embodiment in the present disclosure is illustrated in FIG. 6 and a result of the entire linearity simulation P1 dB is illustrated in the graph of FIG. 7B.

For example, referring to FIGS. 7A and 7B, it may be appreciated that the P1 dB of the radio frequency switch according to an exemplary embodiment in the present disclosure is changed from 34.49 to 38.8.

Figure 8:
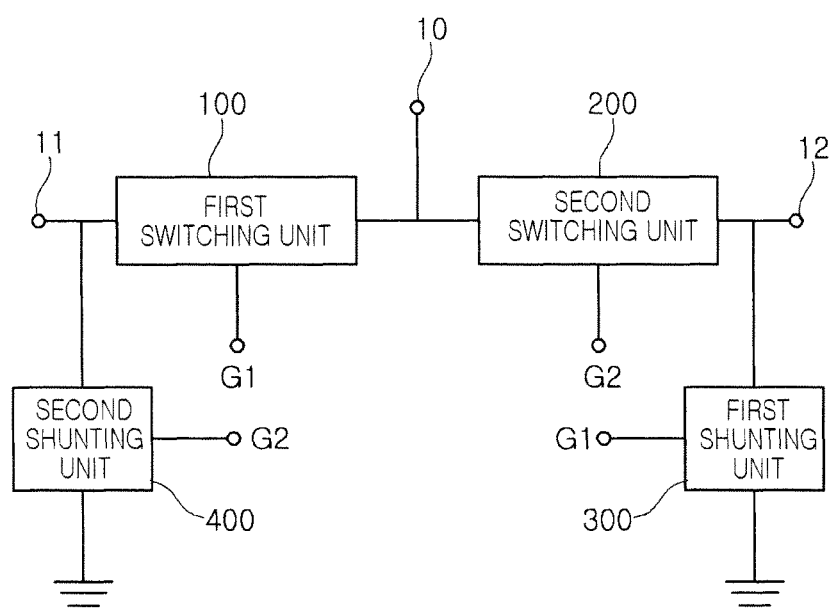
FIG. 8 is a block diagram illustrating a case in which first and second shunting units are added to the radio frequency switch illustrated in FIG. 1.

FIG. 8 is a block diagram illustrating a case in which first and second shunting units 300 and 400 are added to the radio frequency switch illustrated in FIG. 1.

Figure 9:
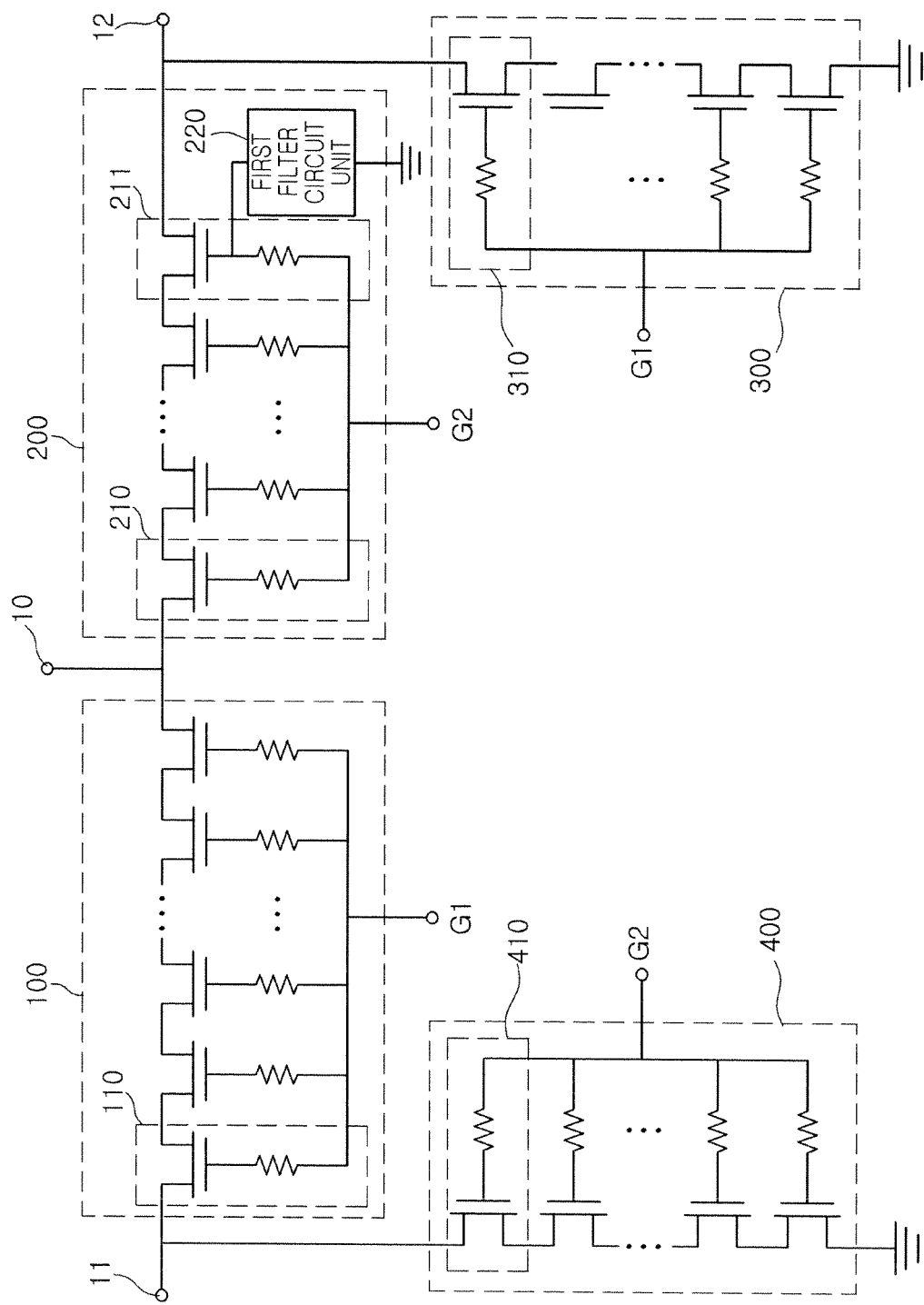
FIG. 9 is a circuit diagram illustrating the radio frequency switch illustrated in FIG. 8 in more detail.

FIG. 9 is a circuit diagram illustrating the radio frequency switch illustrated in FIG. 8 in more detail.

Referring to FIGS. 8 and 9, the radio frequency switch according to an exemplary embodiment in the present disclosure may further include a first shunting unit 300 and a second shunting unit 400.

The first shunting unit 300 may be connected between the second port 12 and the second switching unit 200 to conduct or block electricity on a signal transfer path between the second port 12 and a ground. In this case, the first shunting unit 300 may include a plurality of first switch elements connected in series. The plurality of first switch elements may respectively perform a switching operation by receiving a control signal through a first common control terminal G1.

The second shunting unit 400 may be connected between the first port 11 and the first switching unit 100 to conduct or block electricity on a signal transfer path between the first port 11 and a ground. In this case, the second shunting unit 400 may include a plurality of second switch elements connected in series. The plurality of second switch elements may respectively perform a switching operation by receiving a control signal through a second common control terminal G2.

The first shunting unit 300 may perform the same switching operation as that of the first switching unit 100. In addition, the second shunting unit 400 may perform the same switching operation as that of the second switching unit 200.

For example, when a control signal applied to the first common control terminal G1 of the first switching unit 100 is a high signal and a control signal applied to the second common control terminal G2 of the second switching unit 200 is a low signal, all of the plurality of first switch elements included in the first switching unit 100 are turned-on, such that the signal transfer path between the first port 11 and the common port 10 may have conduction. In addition, all of the plurality of second switch elements included in the second switching unit 200 are turned-off, such that the signal transfer path between the second port 12 and the common port 10 may be blocked from becoming conductive.

In this case, the first shunting unit 300 may be in the turned-on state to conduct electricity on the signal transfer path between the second port 12 and the ground, and the second shunting unit 400 may be in the turned-off state to block electricity on the signal transfer path between the first port 11 and the ground. For example, a path from the first port 11 to the common port 10 may be in a state in which it is available for use.

Therefore, a first radio frequency signal may be smoothly transferred between the common port 10 and the first port 11, and the second switching unit 200 and the first shunting unit 300 are operated in the turned-off state, such that an unnecessary transmission of the first radio frequency signal may be prevented.

Figure 10:
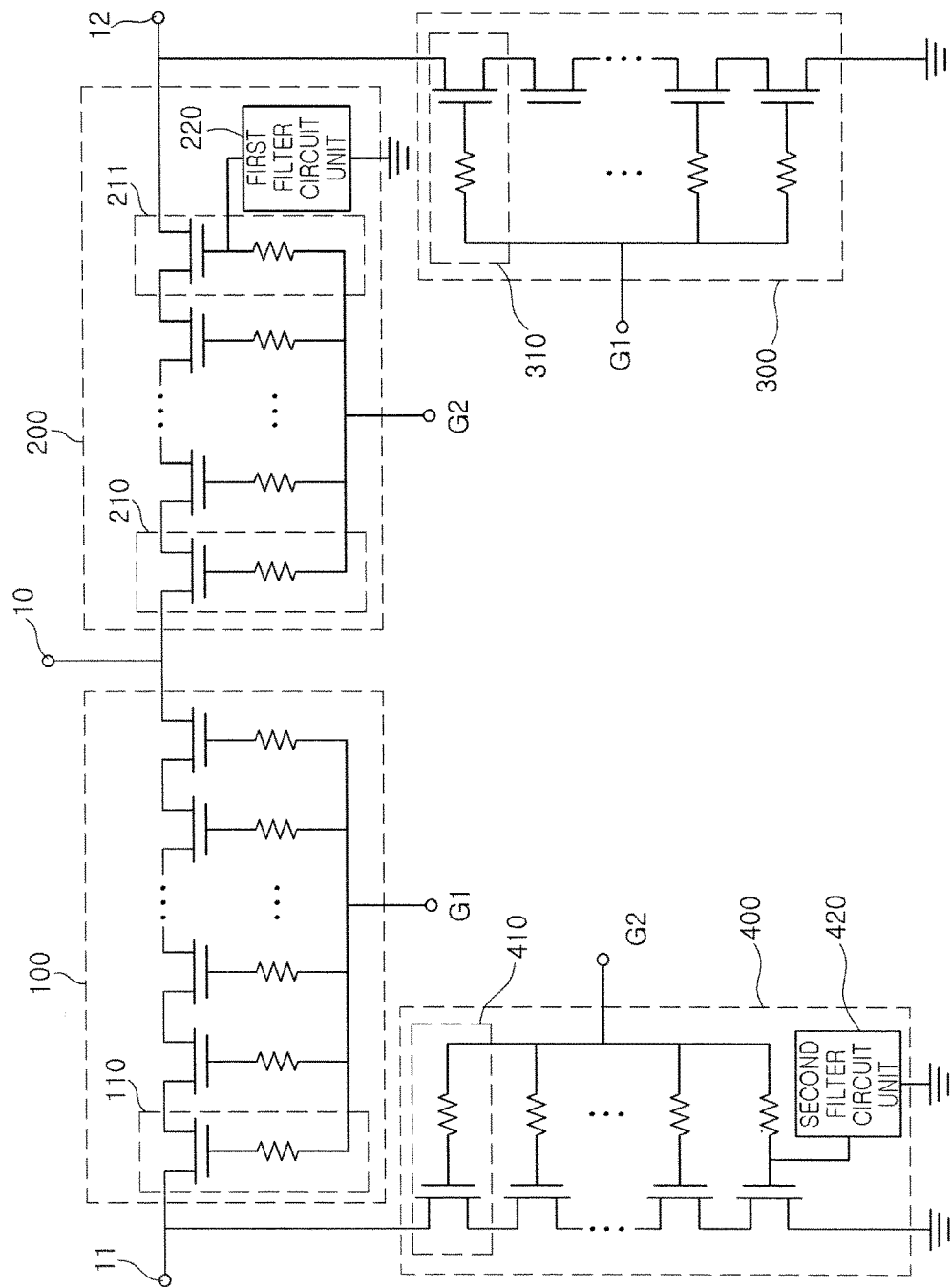
FIG. 10 is a circuit diagram illustrating a case in which a second filter circuit unit is added to the second shunting unit in the configurations of the radio frequency switch illustrated in FIG. 9.

FIG. 10 is a circuit diagram illustrating a case in which a second filter circuit unit 420 is added to the second shunting unit 400 in the configurations of the radio frequency switch illustrated in FIG. 9.

The radio frequency switch according to an exemplary embodiment in the present disclosure may remove the second harmonic component input via the control terminal of at least one second switch element included in the second shunting unit 400, in the same manner as that of the first filter circuit unit 220, by including the second filter circuit unit 420 in the second shunting unit 400 performing the same switching operation as that of the second switching unit 200.

As set forth above, according to exemplary embodiments of the present disclosure, the radio frequency switch may remove the second harmonic component of the non-linear components occurring due to a parasitic capacitor, whereby overall linearity may be increased.

While exemplary embodiments have been shown and described above, it will be apparent to those skilled in the art that modifications and variations could be made without departing from the scope of the present invention as defined by the appended claims.

What is claimed is:

1. A radio frequency switch, comprising:
a common port transmitting and receiving a radio frequency signal;
a first switching unit having a plurality of first switch elements connected in series and opening or closing a signal transfer path between a first port inputting and outputting the radio frequency signal and the common port; and
a second switching unit including a plurality of second switch elements connected in series and opening or closing a signal transfer path between a second port inputting and outputting the radio frequency signal and the common port,
wherein the second switching unit further includes a first filter circuit unit connected to a control terminal of at least one second switch element of the plurality of second switch elements to remove at least one preset frequency band signal, and the first filter circuit unit is not directly connected to the signal transfer path of the second switching unit.

2. The radio frequency switch of claim 1, wherein the first filter circuit unit removes a second harmonic component input from the control terminal of the at least one second switch element.

3. The radio frequency switch of claim 1, wherein the first filter circuit unit includes at least one capacitor and at least one inductor connected to the at least one capacitor in parallel or in series.

4. The radio frequency switch of claim 3, wherein the first filter circuit unit attenuates a signal within a frequency band determined according to the at least one capacitor and the at least one inductor.

5. The radio frequency switch of claim 1, further comprising:

a first shunting unit connected between the second port and the second switching unit to conduct or block electricity on a signal transfer path between the second port and a ground; and a second shunting unit connected between the first port and the first switching unit to conduct or block electricity on a signal transfer path between the first port and a ground, wherein the first shunting unit has a plurality of third switch elements connected in series and the second shunting unit has a plurality of fourth switch elements connected in series.

6. A radio frequency switch, comprising:

a common port transmitting and receiving a radio frequency signal;

a first switching unit having a plurality of first switch elements connected in series and opening or closing a signal transfer path between a first port inputting and outputting the radio frequency signal and the common port;

a second switching unit including a plurality of second switch elements connected in series and opening or closing a signal transfer path between a second port inputting and outputting the radio frequency signal and the common port;

a first shunting unit connected between the second port and the second switching unit to conduct or block electricity on a signal transfer path between the second port and a ground; and a second shunting unit connected between the first port and the first switching unit to conduct or block electricity on a signal transfer path between the first port and a ground, wherein the first shunting unit has a plurality of third switch elements connected in series and the second shunting unit has a plurality of fourth switch elements connected in series, wherein the second switching unit further includes a first filter circuit unit connected to a control terminal of at least one second switch element of the plurality of second switch elements to remove at least one preset frequency band signal, and wherein the second shunting unit further includes a second filter circuit unit connected to a control terminal of at least one fourth switch element among the plurality of fourth switch elements, and the second filter circuit unit removes a second harmonic component input from the control terminal of the at least one fourth switch element.

7. The radio frequency switch of claim 1, wherein the first filter circuit unit is connected to a control terminal of a second switch element disposed closest to the second port and connected to the second port.

8. A radio frequency switch, comprising:

a common port transmitting and receiving first and second radio frequency signals;

a first switching unit having a plurality of first switch elements connected in series and opening or closing a signal transfer path between a first port inputting and outputting the first radio frequency signal and the common port; and a second switching unit including a plurality of second switch elements connected in series and opening or closing a signal transfer path between a second port inputting and outputting the second radio frequency signal and the common port, wherein the second switching unit further includes a first filter circuit unit connected to a control terminal of at least one second switch element among the plurality of second switch elements and having at least one capacitor and at least one inductor connected to the at least one capacitor in parallel or in series.

9. The radio frequency switch of claim 8, wherein the first filter circuit unit is connected to a control terminal of a second switch element positioned closest to the second port among the plurality of second switch elements.

10. The radio frequency switch of claim 8, wherein the first filter circuit unit removes a second harmonic component input from the control terminal of the at least one second switch element.

11. The radio frequency switch of claim 8, wherein the first filter circuit unit removes at least one preset frequency band signal, from the second radio frequency signal, and the at least one preset frequency band signal is determined according to the at least one capacitor and the at least one inductor.

12. The radio frequency switch of claim 8, further comprising:

a first shunting unit connected between the second port and the second switching unit to conduct or block electricity on a signal transfer path between the second port and a ground; and a second shunting unit connected between the first port and the first switching unit to conduct or block electricity on a signal transfer path between the first port and a ground, wherein the first shunting unit has a plurality of third switch elements connected in series and the second shunting unit has a plurality of fourth switch elements connected in series.

13. The radio frequency switch of claim 12, wherein the second shunting unit further includes a second filter circuit unit connected to a control terminal of at least one fourth switch element among the plurality of fourth switch elements, and the second filter circuit unit removes a second harmonic component input from the control terminal of the at least one fourth switch element.

* * * * *